United States Patent
Crema

(10) Patent No.: US 10,763,195 B2
(45) Date of Patent: Sep. 1, 2020

(54) LEADFRAME PACKAGE USING SELECTIVELY PRE-PLATED LEADFRAME

(71) Applicant: STMICROELECTRONICS S.r.l., Agrate Brianza (IT)

(72) Inventor: Paolo Crema, Vimercate (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 15/934,783

(22) Filed: Mar. 23, 2018

(65) Prior Publication Data

US 2019/0295934 A1  Sep. 26, 2019

(51) Int. Cl.
  *H01L 23/495* (2006.01)
  *H01L 23/00* (2006.01)
  *H01L 21/48* (2006.01)

(52) U.S. Cl.
  CPC .... *H01L 23/49582* (2013.01); *H01L 21/4821* (2013.01); *H01L 23/49503* (2013.01); *H01L 23/49541* (2013.01); *H01L 24/48* (2013.01); *H01L 2224/48249* (2013.01)

(58) Field of Classification Search
  None
  See application file for complete search history.

(56) References Cited

U.S. PATENT DOCUMENTS

| | | | |
|---|---|---|---|
| 2003/0146497 A1* | 8/2003 | Abbott | H01L 24/48 257/666 |
| 2004/0150086 A1* | 8/2004 | Lee | H01L 23/3107 257/678 |
| 2005/0121331 A1* | 6/2005 | Kinoshita | C25D 3/56 205/252 |
| 2013/0062742 A1* | 3/2013 | Warren | H01L 24/48 257/666 |

\* cited by examiner

*Primary Examiner* — Bilkis Jahan
(74) *Attorney, Agent, or Firm* — Seed IP Law Group LLP

(57) ABSTRACT

The present disclosure is directed to a leadframe package with a surface mounted semiconductor die coupled to leads of the leadframe package through wire bonding. The leads are partially exposed outside the package and configured to couple to another structure, like a printed circuit board (PCB). The exposed portions, namely outer segments, of the leads include a plating or coating layer of a material that enhances the solder wettability of the leads to the PCB through solder bonding. The enclosed portions, namely inner segments, of the leads do not include the plating layer of the outer segment and, thus, include a different surface material or surface finish.

20 Claims, 4 Drawing Sheets

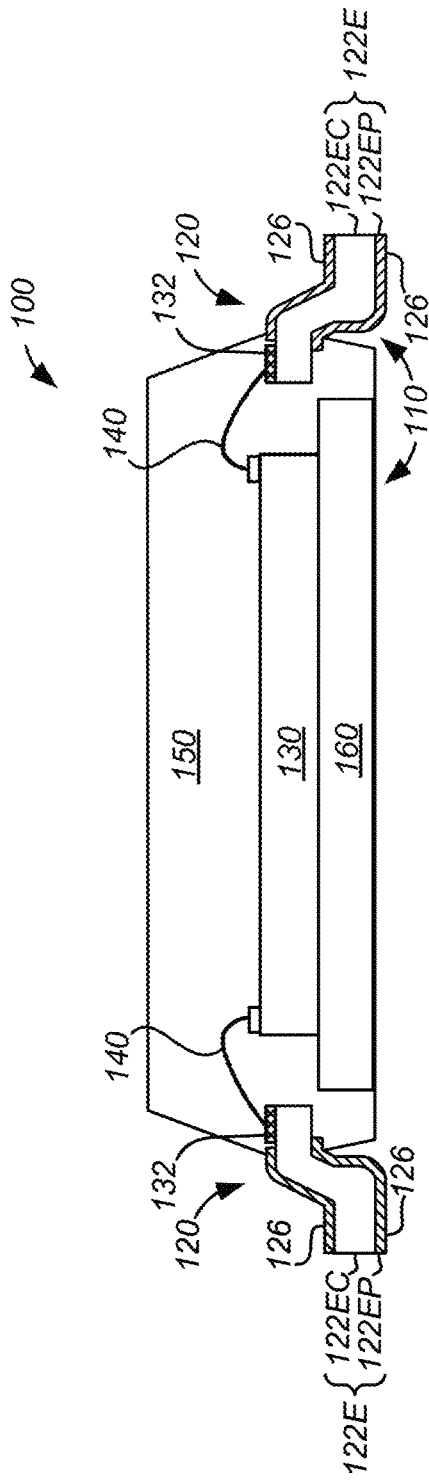
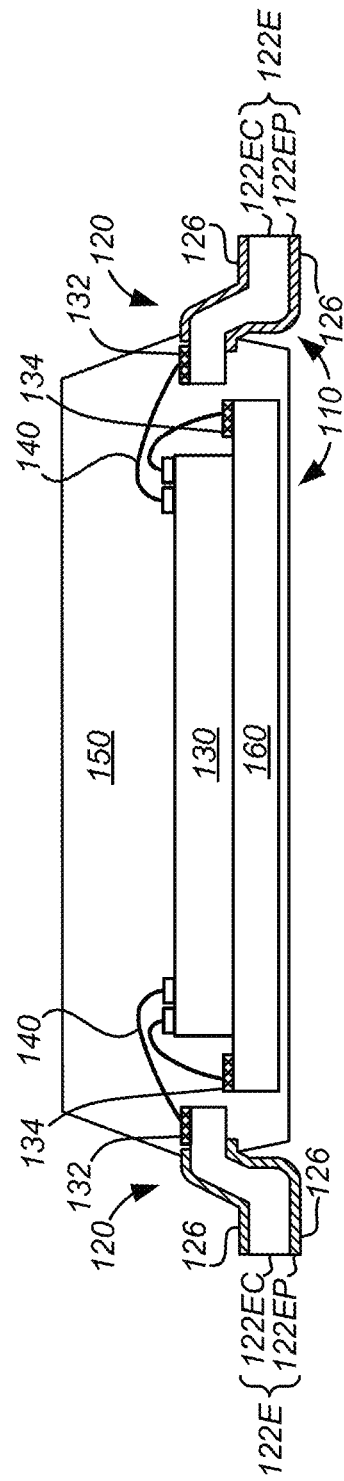

LEADFRAME PACKAGE USING SELECTIVELY PRE-PLATED LEADFRAME

BACKGROUND

Technical Field

The present disclosure is directed to a leadframe-based semiconductor package.

Description of the Related Art

A typical leadframe package includes a semiconductor die having its backside coupled to a leadframe and its active side coupled to various electrical contacts. An encapsulant is then used to cover the combined die and leadframe to create the leadframe package. For a flat no-lead package, a specific type of leadframe package, the leads are exposed on a surface of the package but do not extend out beyond the sides of the package. For a quad flat package (QFP), another popular type of surface mount integrated circuit package using a leadframe, "gull wing" leads extend out from each of the four sides of the package. In a further example, a dual in-line package (DIP) includes a leadframe having two parallel rows of pins extending downward from two longer sides of the package.

For a leadframe package, the exposed leads or pins are structured or configured to electrically and mechanically couple to printed circuit boards (PCB). Normally, the coupling is achieved through soldering. Because the base metal of a leadframe is selected from among copper, copper alloys or iron-nickel alloys, which are generally not suitable for wetting, namely not wettable, the base metal of a leadframe is coated with another finish to improve solderability, namely plating. Suitable plating may also protect the exposed leads from oxidation and corrosion.

Leadframe plating may be achieved before a leadframe is used in a chip assembly process, namely pre-plating, or may be conducted after the encapsulation process of a chip package, namely post-plating. The post-plating process usually applies a coating of tin-based alloy onto the exposed lead or pin of a chip package through hot dipping or electroplating. In a conventional pre-plating process, palladium covers the entire leadframe surface prior to the leadframe being used in a chip packaging process.

BRIEF SUMMARY

Examples of the present disclosure are directed to a leadframe package with a surfaced mounted semiconductor die coupled to leads of the leadframe package through coupling medium including, but not limited to, wire bonds and solder bumps. The leadframe of the leadframe package includes multiple conductive leads that are partially exposed from the package and configured to couple to another structure, like a printed circuit board (PCB). The exposed portions or outer segments, of the leads include a plating or coating layer of a material that enhances the solder wettability of the leads to the PCB through solder bonding. Enclosed portions, namely inner segments, of the leads do not include the plating layer that is on the outer segment and, thus, include a different surface material or surface finish from the outer segment.

The outer segments of the leads are pre-plated, namely the plating layer or film is formed before the leadframe is used in an assembly process. In the process of the assembly, the leads of a leadframe package are separated from the leadframe sheet such that an end surface of the outer segment includes a surface material of the base metal of the lead, which is different from the plating layer on the outer segment.

A leadframe with such selectively plated leads reduces the manufacturing cost. Such a leadframe with selectively plated leads also simplifies a chip assembly process by eliminating the needs for a post-plating process of the exposed leads after the chips are encapsulated.

BRIEF DESCRIPTION OF THE SEVERAL VIEWS OF THE DRAWINGS

In the drawings, identical reference numbers identify similar elements or acts unless the context indicates otherwise. The sizes and relative positions of elements in the drawings are not necessarily drawn to scale.

FIG. 1C is an example cross-sectional view of the quad flat package of FIG. 1A through line 1C-1C;

FIG. 1D is another example cross-sectional view of the quad flat package of FIG. 1A through line 1C-1C;

DETAILED DESCRIPTION

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Figure 1A:
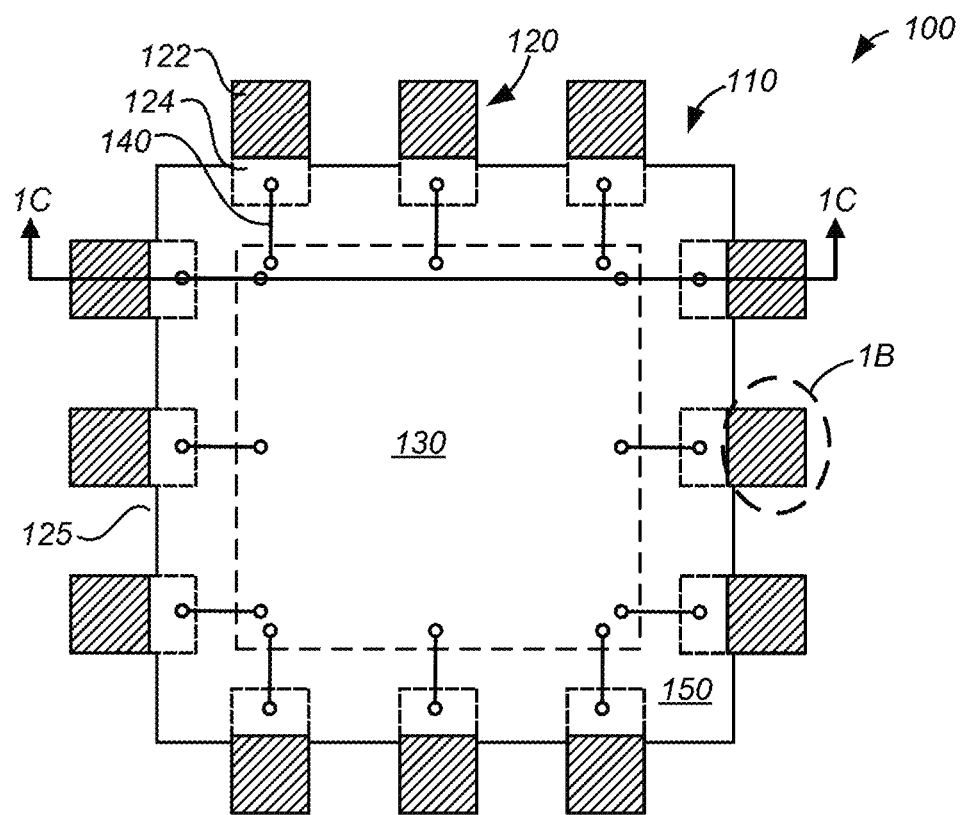
FIG. 1A is a plan view of an example quad flat package according to the disclosure.
Figure 1B:
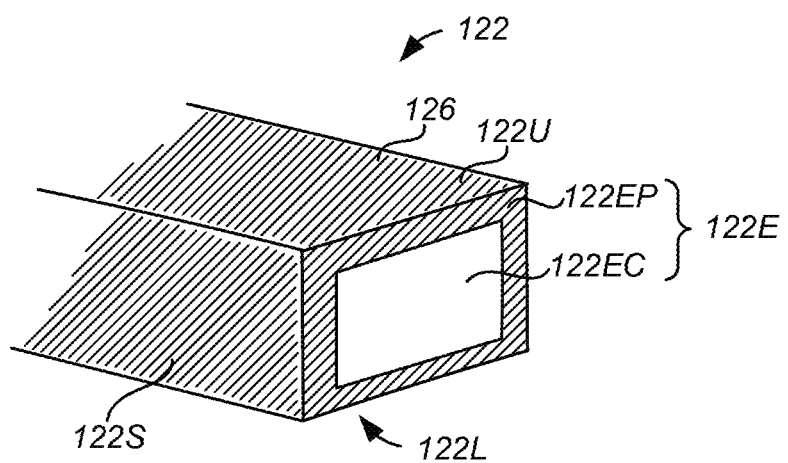
FIG. 1B shows a perspective view of an outer segment of a lead of the quad flat package of FIG. 1A.

The present disclosure is generally directed to a leadframe package, e.g., a quad flat no-lead package (QFN), with a surface mounted structure and a leadframe having selectively or locally plated external lead or pin segments. An example leadframe package (device) 100 is shown in FIGS. 1A-1C. Referring to FIG. 1A, which shows a plan view of an example leadframe package 100, illustrated as a Quad Flat Package (QFP). Leadframe package 100 includes a leadframe 110 that includes leads 120 and a die pad or paddle (not shown in FIG. 1A). Lead 120 may include an outer segment 122, namely a segment of the lead 120 that is exposed outside encapsulation 150 of the leadframe package 100, and an inner segment 124, namely, a segment of the lead 120 that is enclosed within the encapsulation 150. Outer lead segments 122 are positioned and extending from sides or edges 125 of package 100. FIG. 1A shows that the outer segment 122 is a portion of lead 120 that extends out of encapsulation 150, which is nonlimiting. Each outer segment 122 may be exposed out of encapsulation 150 in any manner, which are all included in the disclosure. For example, as will be described herein, the outer segment 122 may be a surface of lead 120 that is exposed outside encapsulation 150.

A semiconductor die 130 is attached to the die pad (not shown in FIG. 1A) of leadframe 110, e.g., through a die attach layer or adhesive layer (not shown for simplicity) and is coupled to inner segments 124 of leads 120 through wire bonds 140. FIG. 1A shows, as an illustrative example, that die 130 is directly wire bonded to lead 120 through wire bond 140, which is nonlimiting. Other configurations of wire bonding are also possible and included in the disclosure. For example, die 130 may be coupled to inner segments 124 through wire bonds. Namely, die 130 may be indirectly coupled to inner segment 124 through wire bonds. The substrate may be a dedicated substrate for electrical couplings, another die in a stack or three-dimensional (3D) die package architecture, or an embedded connection pattern within the die pad of leadframe 110.

Outer segment 122 is selectively plated or pre-plated with a noble metal or metal alloy material that is different from a surface material of inner segment 124. The noble metal or alloy plating is resistant to corrosion and oxidation. In an embodiment, the plating material for the outer segment 122 is chosen to have good soldering properties, solderable, with respect to a solder material that is used to solder outer segment 122 to connection pads of a PCB. The good soldering properties may include solder wettability (or bondability), mechanical properties, thermal properties and electrical properties. For example, the plating material of outer segment 122 has good soldering properties with the Tin (Sn) and Silver (Ag) based non-lead (Pb) solder material. In addition, as outer segment 122 is pre-plated, the plating material has a thermal property that enables it to sustain the high processing temperatures of the chip packaging processes. For example, when molding compounds are used to form the encapsulation layer 150, the plating material of outer segment 122 is chosen to have a melting point higher than about 230° C. In an embodiment, the plating material of the outer segment 122 includes bismuth (Bi) or a Bi alloy. Inevitable or accidental impurities are also included, which do not change the scope of the disclosure. In an embodiment, the plated bismuth or bismuth alloy layer has a thickness of about 10 microns.

It should be appreciated that as leadframe 110, or specifically outer segment 122 of lead 120, is pre-plated, i.e., plated before the encapsulation layer 150 is applied, outer segment 122 may be partially enclosed within encapsulation layer 150 and inner segment 124 may be partially exposed out of encapsulation layer 150. Outer segment 122 and inner segment 124 are not literally defined based on whether they are inside or outside of encapsulation layer 150, but are defined relative to one another and based on the different surface materials. Namely, outer segment 122 is outer to die 130 (or the die pad of leadframe 110) relative to inner segment 124.

FIG. 1B shows, in a three-dimensional view, an example outer segment 122. As shown in FIG. 1B, example outer segment 122 includes upper surface 122U, side surfaces 122S, lower surface 122L and end surface 122E. One or more of the upper surface 122U, side surfaces 122S and lower surface 122L includes plating layer 126, while the central portion of end portion 122E includes a surface material or surface finish different from plating layer 126. The reason is that end surface 122E is obtained when leads 120 are singulated from the leadframe sheet, i.e., a cut-off surface of the lead 120. Outer segment 122 is pre-plated to obtain the plating layer 126, the cut-off from the leadframe sheet will expose the underlying material, normally the base metal of leadframe 110, which exhibits on the center of end surface 122E.

In an example, as shown in FIG. 1B, end surface 122E include a center portion 122EC and a peripheral portion 122EP on one or more edges of end surface 122E (shown as on all four edges). The center portion 122EC includes an underlying metal material of outer segment 122, which is different from the plating layer 126. Peripheral portion 122EP is an edge of the plating layer 126 shown on end surface 122E. That is, peripheral portion 122EP also exist as corresponding to one or more of the upper surface 122U, side surfaces 122S and lower surface 122L that includes plating layer 126. That is, the center portion 122EC may extend to the edge of end surface 122E in the case that there is no peripheral portion 122EP on that edge.

FIG. 1B shows that end surface 122E is the outmost vertical surface of outer segment 122, which is nonlimiting. End surface 122E may be other surfaces where lead 120 is singulated from the sheet of leadframes. Further, FIG. 1B shows, as an illustrative example, that upper surface 122U, side surfaces 122S and lower surface 122L meet with one another with a respective edge line. This example is also not limiting. Upper surface 122U, side surfaces 122S and lower surface 122L may smoothly transit to one another or may be integral portions of a continuous surface, like a cylindrical surface.

Center portion 122EC of end surface 122E may include the base metal of leadframe 110. The base metal may be copper, copper alloy, alloy 42 or other suitable base metals for a leadframe. In an embodiment, one or more additional plating or coating layers may exist between the plating layer 126 and the base metal. The additional plating or coating layer may include nickel and/or palladium or other suitable coating materials. In an embodiment, center portion 122EC of end surface 122E includes a same surface material as that of inner portion 124, which may be a base metal material of leadframe 110 or may be any intermediate or underlying coating between surface plating layer 126 and the base metal material.

FIG. 1C shows a cross-sectional view of leadframe package 100 from cutting-plane 1C-1C of FIG. 1A. As shown in FIG. 1C, semiconductor die 130 is positioned on and attached to die pad 160 of leadframe 110 through, e.g., die attach layer (not shown for simplicity). Outer segment 122 of lead 120 includes pre-plating layer 126 on one or more multiple surfaces, which has a plating material different than the surface material of surfaces 128 of inner segment 144. Further, the end surface 122E includes a different surface material at the center portion 122EC thereof other than the pre-plating layer 126. In an embodiment, the surface material of the center portion 122EC is the same as the surface material of the surfaces 128 of inner segment 124.

FIG. 1C shows that outer segment 122 extrudes out of encapsulation layer 150 and the plating layer 126 is on portion of lead 120 that extrudes out from encapsulation layer 150. However, due to the pre-plating nature of plating layer 126, in an embodiment, plating layer 126 of outer segment 122 is also partially enclosed within encapsulation layer 150, which maximizes the protection of the underlying material, e.g., base metal, of lead 120. However, this embodiment is nonlimiting. In other examples, plating layer 126 may be wholly outside encapsulation layer 150 and further, the inner segment 124 may be partially exposed outside of encapsulation layer 150, which are all included in the disclosure.

FIG. 1C shows that plating layer 126 is an epitaxial or superficial layer on top of one or more surfaces of outer segment 122, which is nonlimiting. Plating layer 126 may also be formed within a dedicated recess portion on one or more surfaces of outer segment 122, or may be formed via a chemical reaction involving the underlying base metal materials of lead 120, which are all included in the disclosure.

FIG. 1C shows that bottom surface 162 of die pad 160 is exposed outside encapsulation 150, which facilitates heat dissipation through die pad 160, but does not limit the scope of the disclosure. In other embodiments, bottom surface 162 of die pad 160 may be enclosed within encapsulation layer 150.

Optionally, inner segment 124 of lead 120 also includes a plating layer 132 on one or more surfaces. Plating layer 132 is also formed through a pre-plating process and includes a different material than plating layer 126. As inner segment 124 is dedicated for wire bonding with die 130, the plating layer 132 may include a material suitable for electrical connectivity and/or for enhancing electrical connectivity. For example, the plating layer 132 may include copper (Cu), silver (Ag) or gold (Au) or other suitable materials for enhancing electrical connectivity for wire bond 140.

FIG. 1D shows a cross-sectional view of another embodiment of leadframe package 100 having different components than FIG. 1C, but taken through a similar cutting-plane 1C-1C of FIG. 1A. As shown in FIG. 1D, inner segment 124 of lead 120 includes a plating layer 132 on one or more surfaces. Plating layer 132 is also formed through a pre-plating process and includes a different material than plating layer 126. As inner segment 124 is dedicated for wire bonding with die 130, the plating layer 132 may include a material suitable for electrical connectivity and/or for enhancing electrical connectivity. For example, plating layer 132 may include copper (Cu), silver (Ag) or gold (Au) or other suitable materials for enhancing electrical connectivity for wire bond 140.

In an embodiment, as shown in FIG. 1D, one or more surfaces of die pad 160 may also be selectively plated with a plating layer 134. Plating layer 134 may include a material suitable for enhancing electrical connectivity of wire bonds, which connect die 130, die pad 160 and lead 120 to one another, wire bonds connecting die 130 and die pad 160 are shown for illustration. In an embodiment, plating layer 134 includes the same material as plating layer 132 and may be formed in a same plating process, e.g., an electroplating process.

As shown in FIG. 1D, as an illustrative example, bottom surface 162 of die pad 160 may be enclosed within encapsulation layer 150.

FIGS. 1C and 1D show, as illustrative examples, that lead 120 is a "gull wing" lead, which is not limiting. Lead 120 may be other type of leads of leadframe 110, e.g., "J bend", leads, which are all included in the disclosure.

Figure 2A:
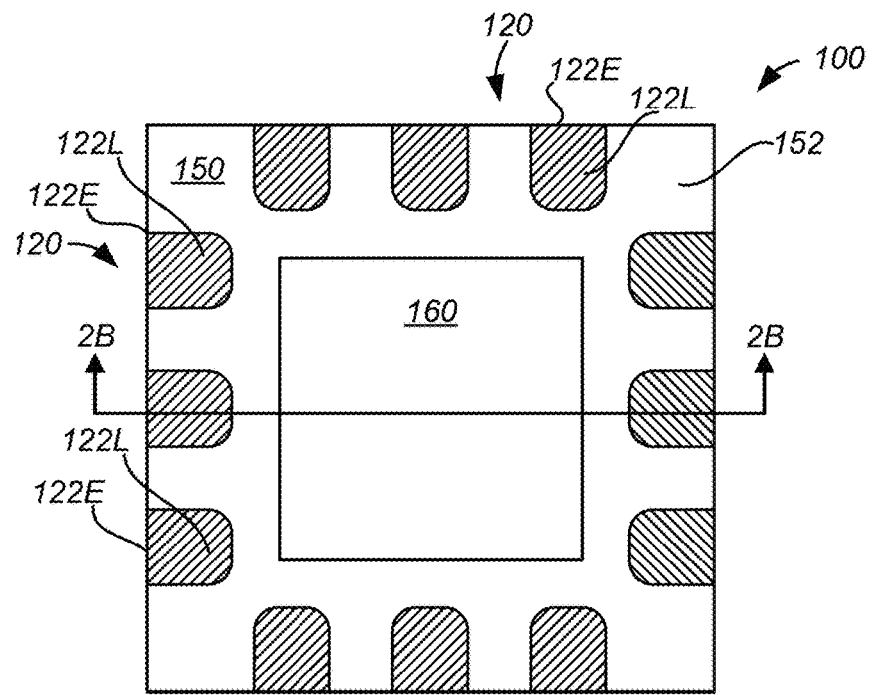
FIG. 2A is a plan view of an example quad flat non-lead package according the disclosure.
Figure 2B:
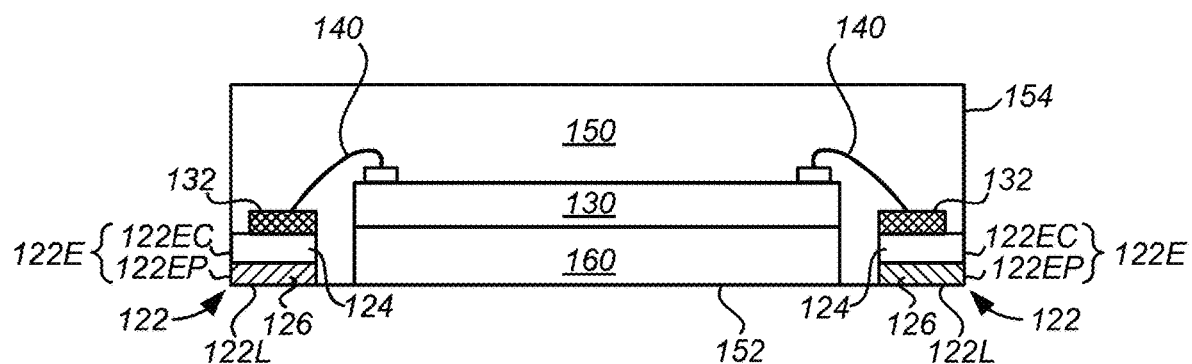
FIG. 2B is a cross-sectional view of the quad flat non-lead package of FIG. 2A through line 2B-2B.

FIGS. 2A and 2B show another example leadframe package 100, a QFN package. FIG. 2A shows a bottom plan view of an example QFN package 100, namely bottom surface 152 of package 100, and FIG. 2B shows a cross-sectional view from cutting plane 2B-2B. Here with a non-lead package, outer segment 122 includes at least two exposed surfaces of lead 120, lower surface 122L and at least one end surface 122E. Note that in the case that a lead 120 is positioned at the corner of bottom surface 152 of package 100, outer segment 122 may include lower surface 122L and two end surface 122E because lead 120 may be singulated from the leadframe sheet by two surfaces.

Exposed lower surface 122L and one end surface 122E are each substantially coplanar with and embedded in a respective exterior surface of encapsulation layer 150. The plating layer 126 may be on one or more of the exposed surfaces of the outer segment 122.

As shown in FIG. 2B, lower surface 122L includes a plating layer 126. FIG. 2B shows that plating layer 126 of lower surface 122L fully covers the lower surface of lead 120, which is nonlimiting. In other embodiments, plating layer 126 or lower surface 122L of outer segment 122 may partially constitute the lower surface of lead 120 and the rest of the lower surface 120 may be part of the inner segment 124 and may be enclosed within encapsulation layer 150.

For the example QFN package 100, or generally for a non-lead package 100, lower surface 122L or plating layer 126 is substantially coplanar with lower surface 152 of package 100. This is an advantage and a difference of pre-plated plating layer 126 over post-plating, because post-plating will form a raise-up plating film that bumps up from the bottom surface 152 of package 100.

End surface 122E is substantially flush with a respective side surface 154 of encapsulation layer 150 of package 100. End surface 122E includes a center portion 122EC of a material different than those of plating layer 126 and that of a peripheral portion 122EP, which is an edge of plating layer 126. In an embodiment, center portion 122EC includes a base metal material of lead 120 and any intermediate plating or coating materials between the base metal and plating layer 126.

Plating layer 126 includes a plating material suitable for solder wetting. In an embodiment, plating layer 126 includes 0 one or more of bismuth or bismuth alloy.

In an embodiment, inner segment 124 of lead 120, which is enclosed within encapsulation layer 150, includes another plating layer 132 for wire bonding. Plating layer 132 may include one or more of Cu, Ag, Ag alloy or Au.

Figure 3A:
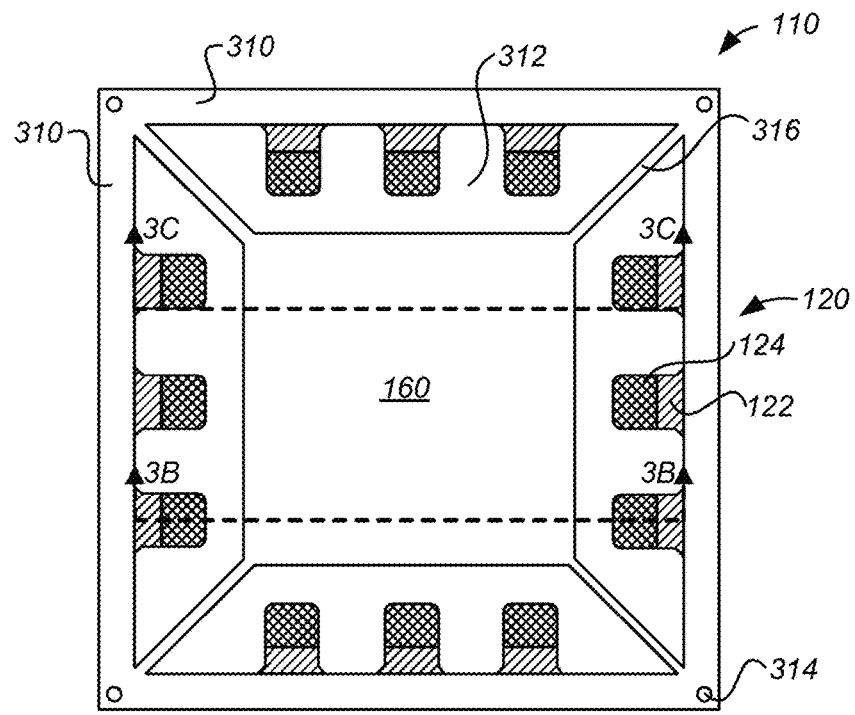
FIG. 3A is a plan view of an example leadframe according to the disclosure.
Figure 3B:
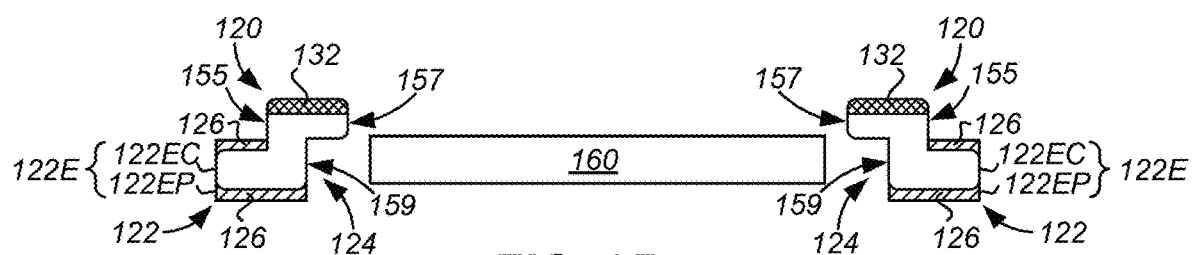
FIGS. 3B and 3C are cross-sectional views of the leadframe of FIG. 3A through lines 3B-3B and 3C-3C respectively.
Figure 3C:
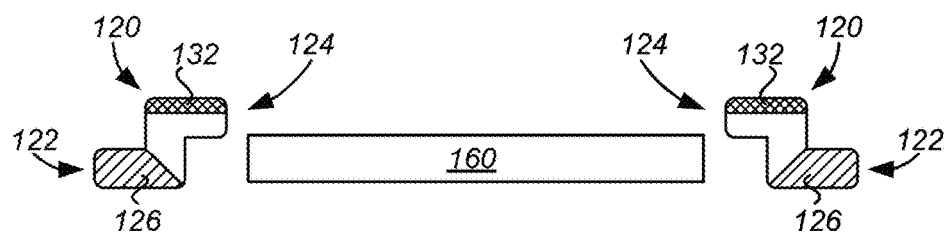

FIGS. 3A, 3B and 3C illustrate an example leadframe 110. FIG. 3A is a plan view, FIG. 3B is a cross-sectional view from cutting plane 3B-3B, and FIG. 3C is a cross-sectional view from cutting plane 3C-3C.

As illustrated herein, leadframe 110 includes a sheet structure(s) 310 (or leadframe sheet 310) that defines a void 312. Guide holes 314 are provided in sheet structure 310 for alignment purposes in die assembly using the leadframe 110.

Die pad 160 is disposed in the center of void 312. Die pad 160 is linked to sheet structure 310 and mechanically supported by link bar 316, normally by the four corners of die pad 160. A plurality of leads 120 extend from sheet structure 310 toward die pad 160. Each lead 120 includes an outer segment 122 and an inner segment 124. Outer segment 122 may include plating layer 126 on one or more of upper surface 122U, lower surface 122L and side surface 122S. End surface 126 is a cut-off surface where lead 120 is singulated apart from sheet structure 310. Because plating layer 126 is pre-plated before the die assembly process and lead 120 is singulated from sheet structure 310 in the die assembly process, end surface 126 includes difference surface material at the center portion 122EC than the plating layer 126.

Lead 120 may also include a different plating layer 132 in inner segment 124.

In an embodiment, leadframe 110 includes a base metal 318 on lead 120 and die pad 160. The base metal may be copper, copper alloy, iron nickel alloy (alloy 42) and other suitable base metals for leadframe. Plating layer 126 may be one or more of bismuth or bismuth alloy. Plating layer 132 may be one or more of silver, silver alloy or gold. The plating process of plating layer 126 of bismuth or bismuth alloy onto outer segment 122 may be achieved through immersion plating or electroplating, or any other suitable plating approaches. For example, in the immersion plating, other portions of leadframe 110 substrate (e.g., of the base metal) may be encapsulated or otherwise covered, exposing the outer segment 126 areas. Then the substrate of the leadframe 110 may be immersed into a bath of bismuth compound and an organic diluent to facilitate a reaction of the bismuth with the substrate containing the base metal. For another example, in the electroplating process, other portions of a substrate of leadframe 110 may be covered by a sample mask, exposing the outer segment 126 areas. Then bismuth or bismuth alloy may be deposited onto the exposed area to form the bismuth or bismuth alloy plating layer 126.

Plating layers 132 on inner segment 124 and plating layers 134 on die pad 160 may be formed before or after the bismuth or bismuth alloy plating layer 126.

Plating layers 132, 143 and 126 are all pre-plated before leadframe 110 is used in a semiconductor chip assembly process.

Plating layer 132 includes a different material than plating layer 126. In an embodiment, plating layer 132 includes one or more of Ag, Ag alloy or Au. Plating layer 126 includes one or more of Bi or Bi alloy.

Because leadframe 110 include plating layers 126, 132 selectively coated on dedicated local areas of the lead 120 and/or the die pad 160, the cost of the material and the plating process is reduced accordingly. Because plating layers 126, 132 are pre-plated before the die assembly process, the die assembly process using the leadframe 110 is simplified and reliability of the die package is enhanced. For example, assembly and testing does not need to send the die package to a vendor for the post-plating and can conduct chip testing right after the chip assembly process.

Leads 120 in FIGS. 3A-3C include a variety of surface materials. For example, end surface 122E includes a part of the base metal 318 material of the lead 120 and a part of the plating layer 126. Side surfaces 155, 157, 159 are the base metal 318 material of the lead 122. Said differently, the lead 120 may include a plurality of exposed surfaces, such that one lead includes a first surface material adjacent to a second surface material adjacent to a third surface material, where all of the first, second and third surface materials distinct from each other.

In the description herein, a quad flat package and a quad flat no-lead package are used as an example of a leadframe package and a leadframe for a quad flat package is used as an example of leadframes. It should be appreciated that the disclosure may be applied in any leadframes and any leadframe packages. Further, the described surface mounted structure or device may also be mounted to other structures, like a printed circuit board (PCB), which is also included in the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a semiconductor die overlaying a die pad;
a molding material encapsulating the semiconductor die;
a lead having a first segment and a second segment, the first segment being exposed from the molding material, the second segment being encapsulated within the molding material; and
a first plating layer fully covering the first segment except for an edge surface of the first segment, the first plating layer including a first plating material different than a surface material of the die pad, the edge surface of the first segment having a second surface material that is same as the surface material of the die pad, the first plating layer partially extending into the molding material and partially covering the second segment within the molding material, the second segment having the second surface material that is uncovered by the first surface material within the molding material.

2. The device of claim 1, wherein the first plating material is one or more of bismuth or a bismuth alloy.

3. The device of claim 1, wherein the first plating material is solderable with a non-lead solder material.

4. The device of claim 1, wherein the first plating material has a melting point higher than about 230° C.

5. The device of claim 1, wherein the second segment includes a second plating material different from the first plating material.

6. The device of claim 5, wherein the second plating material is one or more of silver, a silver alloy or gold.

7. The device of claim 1, wherein the first segment is a lead portion extruding out from the molding material.

8. The device of claim 7, wherein the lead portion includes an end surface having an end surface material different from the first plating material.

9. The device of claim 1, wherein the first segment is a lead portion having at least two exposed surfaces each substantially coplanar with and embedded in a respective exterior surface of the molding material.

10. The device of claim 9, wherein the first plating layer on the first segment is coated on one of the two exposed surfaces and is included on another one of the two exposed surfaces only at a peripheral portion.

11. A device, comprising:
a semiconductor die overlaying a die pad;
a molding material encapsulating the semiconductor die; and
a lead having a first segment and a second segment, the first segment including a first surface and a second surface exposed outside the molding material, the first surface including a first surface material and the second surface including a second surface material at a center of the second surface and the second segment including the second surface material and a third surface material, the second surface material and the third surface material both being different than the first surface material, the first surface material and the second surface material both partially encapsulated by the molding material, the second surface material being exposed from the first surface material within the molding material, the first surface material extending continuously from outside the molding material to inside the molding material.

12. The device of claim 11, wherein the first surface material includes at least one of bismuth or a bismuth alloy.

13. The device of claim 11, wherein the first surface material has a melting point higher than a process temperature of a chip assembly process of the device.

14. The device of claim 11, wherein the third surface material is one or more of silver, a silver alloy or gold.

15. The device of claim 11, wherein the second surface material and the third surface material are the same.

16. The device of claim 15, wherein the second surface material and the third surface material are a base material of the lead.

17. The device of claim 16, wherein the base material is one or more of copper, a copper alloy and a nickel iron alloy.

18. A semiconductor package, comprising:
a semiconductor die;
an encapsulation layer encapsulating the semiconductor die; and
a lead coupled to the semiconductor die, the lead having a first surface material and a second surface material exposed from the encapsulation layer, the first surface material being different from the second surface material, a surface of the lead being substantially coplanar with a surface of the encapsulation layer, the surface of the lead immediately adjacent the surface of the encapsulation layer, the first surface material and the second surface material both partially encapsulated by the encapsulation layer, the second surface material being exposed from the first surface material within the encapsulation layer, the first surface material extending continuously from outside the encapsulation layer to inside the encapsulation layer.

19. The semiconductor package of claim 18, wherein the first surface material includes one or more of bismuth or bismuth alloy.

20. The semiconductor package of claim 19, wherein an edge surface of the lead includes the second surface material.

* * * * *